United States Patent [19]
Liu et al.

[11] Patent Number: 6,080,285
[45] Date of Patent: Jun. 27, 2000

[54] MULTIPLE STEP IONIZED METAL PLASMA DEPOSITION PROCESS FOR CONFORMAL STEP COVERAGE

[75] Inventors: Joanna Liu, Los Altos; Zheng Xu, Foster City, both of Calif.

[73] Assignee: Applied Materials, Inc., Santa Clara, Calif.

[21] Appl. No.: 09/152,651

[22] Filed: Sep. 14, 1998

[51] Int. Cl.$^7$ .................................................. C23C 14/34
[52] U.S. Cl. ................................. 204/192.12; 204/192.15; 204/192.3; 204/192.17; 204/298.06; 204/298.08
[58] Field of Search .................... 204/192.12, 192.15, 204/192.17, 192.3, 298.06, 298.08

[56] References Cited

U.S. PATENT DOCUMENTS

| | | | |
|---|---|---|---|
| 4,874,494 | 10/1989 | Ohmi | 204/192.12 |
| 4,951,601 | 8/1990 | Maydan et al. | 118/719 |
| 4,999,096 | 3/1991 | Nihei et al. | 204/298.06 |
| 5,500,102 | 3/1996 | Ichikawa et al. | 204/298.06 |
| 5,510,011 | 4/1996 | Okamura et al. | 204/298.06 |
| 5,639,357 | 6/1997 | Xu | 204/192.12 |
| 5,863,393 | 1/1999 | Hu | 204/192.3 |
| 5,976,327 | 11/1999 | Tanaka | 204/192.12 |

*Primary Examiner*—Nam Nguyen
*Assistant Examiner*—Daborah Chacko-Davis
*Attorney, Agent, or Firm*—John P. Taylor

[57] ABSTRACT

A multiple step process sputter deposits material of uniform thickness on stepped surfaces of an integrated circuit substrate such as the surfaces of a high aspect ratio via or a narrow trench. Material is first sputter deposited at the bottom of the opening at high pressure using a source of high power RF energy connected to a coil in the deposition chamber to couple energy into the plasma. A high power RF bias is applied to the substrate, and a low power DC bias is applied to the sputtering target. The same parameters are repeated in a second step except that the high power RF bias on the substrate support is either reduced to a low power level or reduced to zero (by the end of the second step) to deposit on the lowest quarter of the sidewall of the opening. In a third step, no RF bias is applied to the pedestal remains and the pressure is reduced to a medium pressure state, resulting in a deposition on the second quarter of the sidewall of the opening. In a fourth step, the RF power coupled to the plasma is reduced to a low level, resulting in deposition on the third quarter of sidewall of the opening. Finally, the last quarter of the sidewall of the opening is deposited upon by lowering the pressure further to a low pressure state and applying a high power DC bias to the target.

32 Claims, 6 Drawing Sheets

| STEP | 1 | 2 | 3 | 4 | 5 |
|---|---|---|---|---|---|
| TIME (SECONDS) | 12 | 12 | 7.5 | 7.5 | 3 |
| CHAMBER PRESSURE | HIGH | | MEDIUM | LOW | |
| RF POWER ON COIL | HIGH | | | LOW | |
| RF BIAS ON PEDESTAL | HIGH | RAMP DOWN | ZERO | | |
| DC BIAS ON TARGET | LOW | | | | HIGH |

FIG. 8

| ANGULAR DISTRIBUTION OF SPUTTERED MATERIAL FROM A SINGLE TARGET LOCATION |||||
|---|---|---|---|---|
| STEP |||||
| 1 | 2 | 3 | 4 | 5 |
| HIGH PRESSURE | HIGH PRESSURE | MEDIUM PRESSURE | MEDIUM PRESSURE | LOW PRESSURE |
| HIGH RF POWER ON COIL | HIGH RF POWER ON COIL | HIGH RF POWER ON COIL | LOW RF POWER ON COIL | LOW RF POWER ON COIL |
| HIGH RF BIAS ON PEDESTAL | RAMP TO ZERO BIAS ON PEDESTAL | ZERO RF BIAS ON PEDESTAL | ZERO RF BIAS ON PEDESTAL | ZERO RF BIAS ON PEDESTAL |
| LOW DC BIAS ON TARGET | LOW DC BIAS ON TARGET | LOW DC BIAS ON TARGET | LOW DC BIAS ON TARGET | HIGH DC BIAS ON TARGET |

MULTIPLE STEP IONIZED METAL PLASMA DEPOSITION PROCESS FOR CONFORMAL STEP COVERAGE

BACKGROUND OF THE INVENTION

1. Field of the Invention

This invention relates to the formation of integrated circuit structures. More particularly, this invention relates to a multiple step process for depositing a conformal film of uniform thickness on stepped surfaces of an integrated circuit surface.

2. Description of the Related Art

In the formation of integrated circuit structures of ever smaller dimensions, it has become important to form vias or contact openings with high aspect (height to width) ratios. Processes and apparatus have been developed to fill such vias or contact openings by sputtering without the formation of voids (by premature deposition on the upper surfaces of the opening) using a plasma beam having very little angular distribution so that the opening fills from the bottom up. A process and apparatus for such sputter deposition may be found in copending U.S. patent application Ser. No. 08/647,184, filed May 9, 1996, abandoned and assigned to the assignee of this invention, the subject matter of which is hereby incorporated by reference.

It has also become necessary to use filler materials for such vias or contact openings which require a liner on the bottom and sidewall surfaces of the via or contact opening which either act as a nucleation layer for the filler material or as a diffusion barrier to prevent the filler material from diffusing into the sidewall of the opening.

However, it is very difficult to form a barrier layer or film of uniform thickness on stepped surfaces such as the bottom and sidewalls of high aspect ratio vias or contact openings using a sputtering process. Nevertheless, at least in some circumstances, a sputter deposition is the desired form of deposition of the particular liner material. It would, therefore, be highly desirable to provide a process wherein a material of uniform thickness could be sputtered onto stepped surfaces on an integrated circuit structure such as, for example, to form a liner or barrier layer on the bottom and sidewall surfaces of a high aspect ratio via or contact opening.

SUMMARY OF THE INVENTION

In accordance with the invention, a multiple step process is used to sputter deposit a material of uniform thickness on stepped surfaces of an integrated circuit structure such as, for example, the bottom and sidewall surfaces of a high aspect ratio via or contact opening, or a narrow trench. During five separate deposition steps, one or more parameters comprising: the pressure in the deposition chamber, the DC power applied to the target, the RF power coupled to the plasma through the coil, and the RF bias on the pedestal holding the semiconductor substrate having sputtered material thereon, are varied to change the angular distribution of the beam of sputtered material to thereby provide a process resulting in a uniform deposition of material on the stepped surfaces such as the bottom and sidewalls of a high aspect ratio opening in a layer of an integrated circuit structure.

In a first deposition step, wherein material is sputter deposited at the bottom of the opening, the sputter deposition is carried out at high pressure using an RF source maintained at high power which is connected to a coil in the deposition chamber to couple energy into the plasma. A high power RF bias is applied to the pedestal supporting the substrate being deposited upon, and a low power DC bias is applied to the sputtering target.

In a second deposition step, the parameters of the first step are retained except that the high power RF bias on the pedestal holding the substrate is either reduced to a low power level at the commencement of the second step, or slowly reduced down to zero by the end of the second step, to thereby increase the angular distribution of the sputtering beam sufficiently to provide a deposition on the lowest quarter or quartile of the sidewall of the opening. In the third deposition step, the RF bias on the pedestal remains at zero (in an off position) and the pressure is now reduced to a medium pressure state, with the other two parameters of low power DC bias on the target and high RF power to the coil remaining the same, resulting in a further increase in the angular distribution of the sputtering beam and deposition on the second quartile of the sidewall of the opening, i.e., to complete the deposition on the lower one-half of the sidewall of the opening.

In the fourth deposition step, the pressure remains at a medium level, the RF bias applied to the pedestal remains at zero, and the DC bias power on the target remains low. However, in this step, the RF power coupled to the plasma through the coil is reduced to a low power level, resulting in a further increase in the angular distribution of the sputtering material and deposition on the sidewalls of the third quartile from the bottom of the opening. Finally, in a fifth deposition step, the last quartile of the sidewalls of the opening is deposited upon by lowering the pressure further to a low pressure level and applying a high power DC bias to the target, while maintaining the RF power to the coil at a low power level and with no RF bias applied to the pedestal. The end result of the five steps of the sputtering process of the mention is the desired deposition of material of uniform thickness on the bottom and sidewalls of the opening.

DETAILED DESCRIPTION OF THE INVENTION

In accordance with the invention, a multiple step process is used to sputter deposit a material of uniform thickness from a sputtering target onto the stepped surfaces of an integrated circuit structure such as, for example, the bottom and sidewall surfaces of a high aspect ratio opening via or contact opening, or a narrow trench. During five separate sputtering steps, one or more parameters comprising: the pressure in the deposition chamber, the DC power applied to the target, the RF power coupled to the plasma through the coil, and the RF bias on the pedestal holding the semiconductor substrate are varied to change the angular distribution of the beam of sputtered material to thereby provide a process resulting in a uniform deposition of material on the bottom and sidewalls of the opening.

By use of the term "high aspect ratio" is meant that the height of the opening exceeds the width of the opening. Preferably, the "high aspect ratio" opening is at least twice the width of the opening.

By use of the term "of uniform thickness, with respect to the material sputter deposited over the stepped surface is meant a layer wherein the thickness does not vary by more than 10% from the thinnest portion of the layer on the stepped surface to the thickest portion over the stepped surface.

The terms "via" and "contact opening" are both used interchangeably herein to describe an opening through an insulating layer, regardless of whether the opening extends down to an underlying contact for an active or passive device (a contact opening) or the opening extends from one metal interconnect layer to another (a via).

The target material to be sputtered to form the desired thin barrier layer or liner on the bottom and sidewall surfaces of the via or contact opening (opening 60 in FIG. 2) may comprise titanium (e.g., for a hot aluminum filler material), titanium nitride (e.g., for a tungsten nucleation layer), tantalum or tantalum nitride (e.g., for a copper diffusion barrier layer), or tungsten nitride (also useful, for example as a copper diffusion barrier). The process could also be used to form a thin copper seed layer (over a previously deposited barrier layer) for subsequent filling of the opening with a copper filler. Other materials capable of being sputtered may also be useful in the practice of the invention.

a. The Sputtering Equipment

Figure 1:
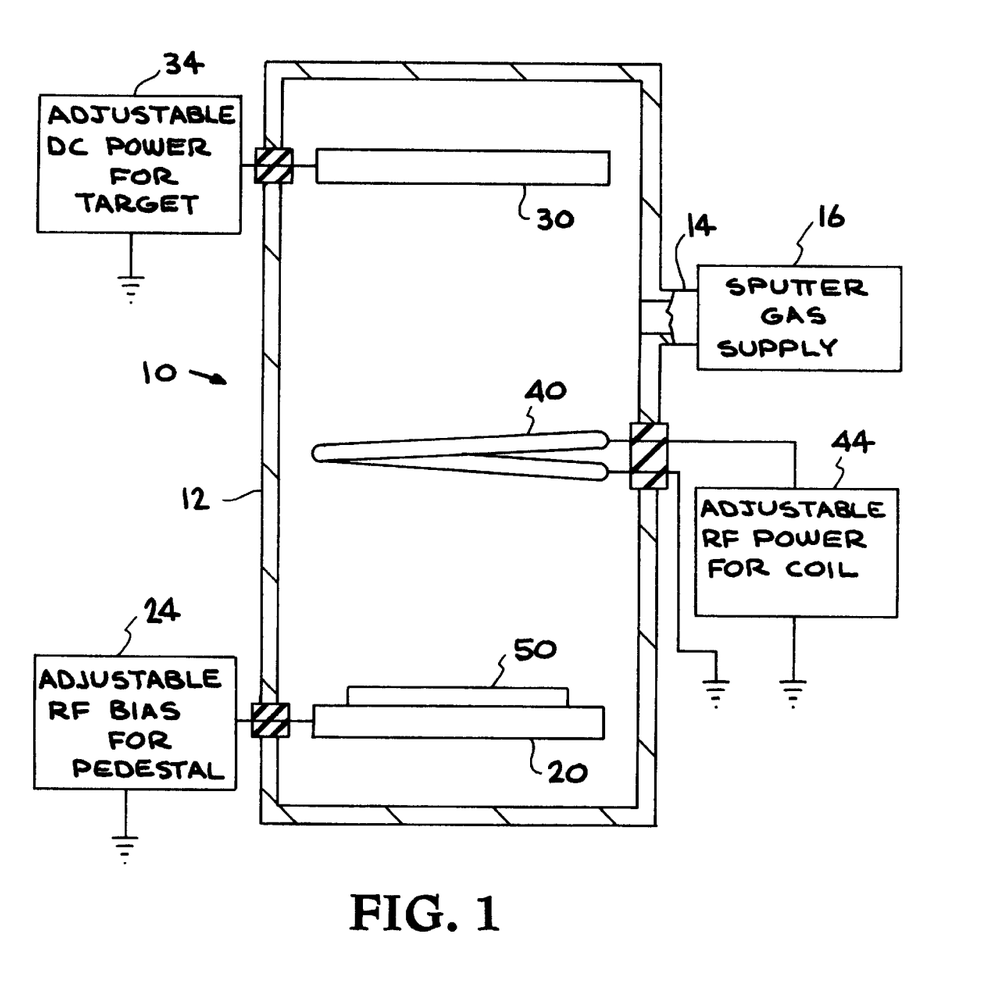
FIG. 1 is a diagrammatic side view depicting the main components of a typical sputter deposition apparatus which may be used in carrying out the process of the invention.

Referring to FIG. 1, it will be seen that a sputtering apparatus 10 comprises a sealed chamber 12 having therein a substrate support pedestal 20 and a target 30 separated from one another in chamber 12, the space between pedestal 20 and target 30 being surrounded by an RF coil 40, preferably a single turn coil having a generally flat surface facing the space. Sputtering gas is fed into chamber 12 from a gas source 16 through an entrance port 14. When sputter depositing a metal such as titanium or tantalum, gas source 16 will preferably comprise an argon gas source, while a mixture of argon and nitrogen gases will be used for the sputter deposition of metal nitrides such as titanium nitride, tantalum nitride, or tungsten nitride.

Substrate support pedestal 20 is shown having a semiconductor substrate 50 mounted thereon by any suitable means, but preferably by a biasable electrostatic chuck (not shown). Substrate support pedestal 20 is connected to an adjustable RF bias power supply 24, which is typically at a frequency of 13.56 MHz. Typically, RF Bias power supply 24 is coupled to support pedestal 20 through the water-cooled cooling plate (not shown) portion of substrate support pedestal 20.

RF coil 40 is inductively coupled to the plasma and provides power thereto by adjustable RF coil power supply 44, which is typically at a frequency of 2 MHz. Sputtering target 30, at least the front surface of which comprises the material to be sputtered, is connected to an adjustable DC power supply 34 to provide a DC bias on the target.

Figure 11:
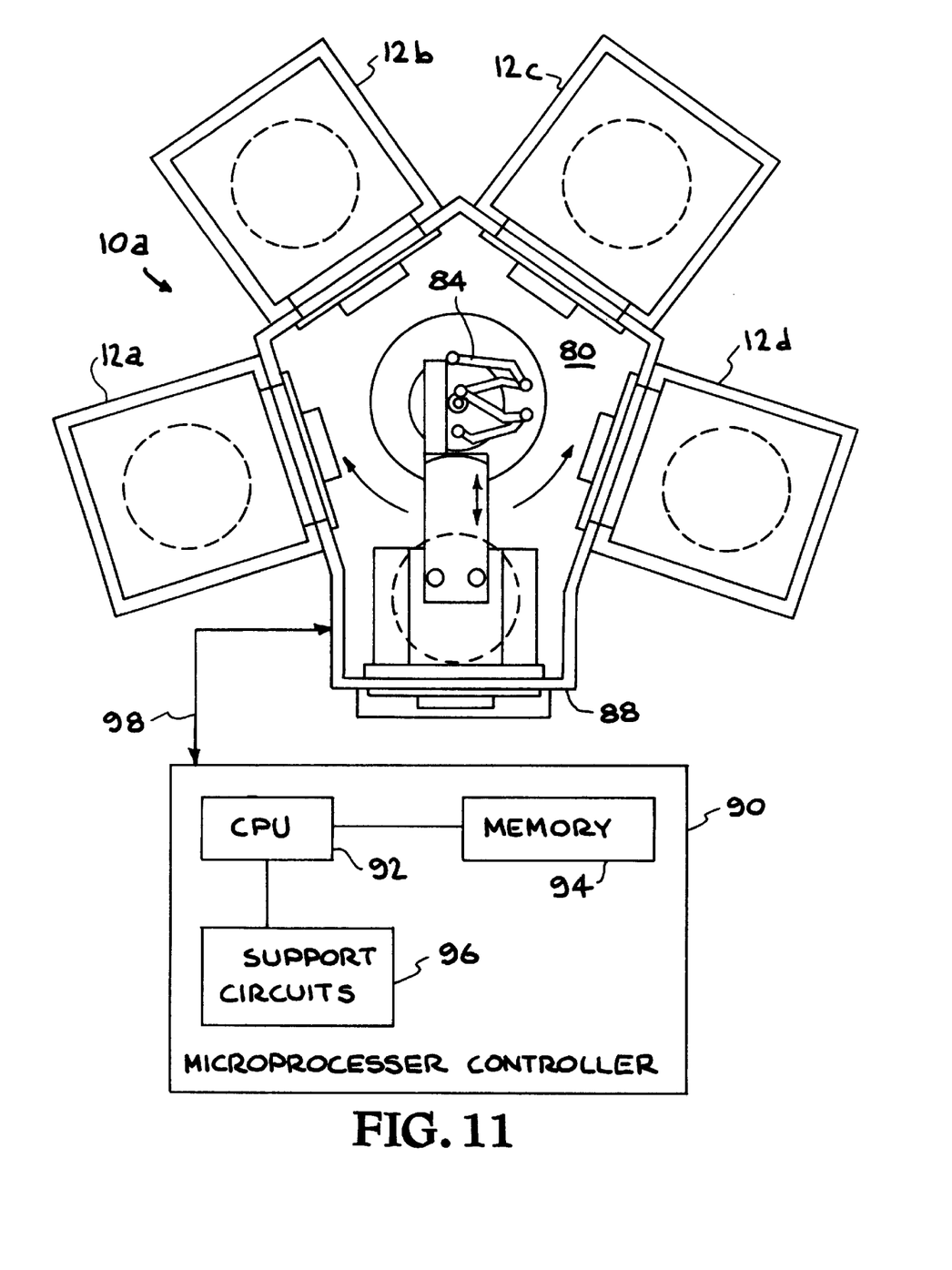
FIG. 11 is a schematic view of an apparatus, including a multiple sputter deposition chamber structure and a computer system, which may be used to carry out the process of the invention.

FIG. 11 shows a multiple reactor chamber apparatus 10a which can be used, if desired, with the process of the invention, for example, where it is desired to carry out some of the sputter deposition steps in one sputter deposition chamber 12a, after which substrate 50 can then be moved under vacuum through intermediate staging chamber 80 to a second sputter deposition chamber 12b in apparatus 10a in which the remainder of the sputter deposition process can be carried out, without, however, exposing substrate 50 to the ambient atmosphere during the deposition process. A more complete description of such a multiple chamber apparatus may be found in Maydan et al. U.S. Pat. No. 4,951,601, entitled MULTI-CHAMBER INTEGRATED PROCESS SYSTEM, assigned to the assignee of this invention, and the description of which is hereby incorporated herein by reference.

More specifically, substrate 50 is loaded into multiple chamber apparatus 10a through load lock chamber 88 and then through intermediate staging chamber 80 to sputter deposition chamber 12a by robot arm 84 wherein one or more of the sputter deposition steps of the process of the invention may then be carried out in chamber 12a. Substrate 50 may then be moved by robot arm 84 back through intermediate staging chamber 80 and into a second sputter deposition chamber 12b to complete the sputter deposition process (if all of the sputter deposition steps have not been carried out in chamber 12a). Robot arm 84 may then transfer substrate 50 either into a further processing chamber or back to load lock chamber 88 for subsequent removal from multiple chamber apparatus 10a.

b. Step 1 of the Process

Figure 2:
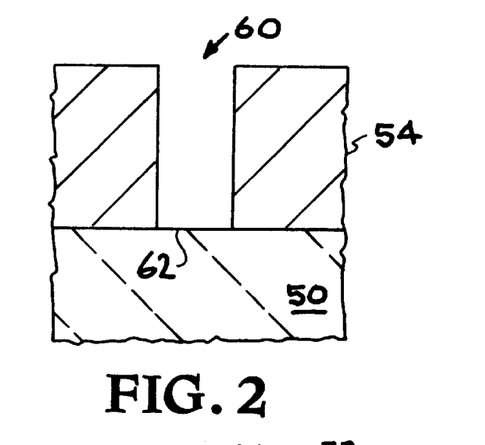
FIG. 2 is a fragmentary vertical side-section view of a semiconductor substrate showing a high aspect ratio opening formed through an insulation layer thereon prior to commencement of the sputter deposition process.
Figure 3:
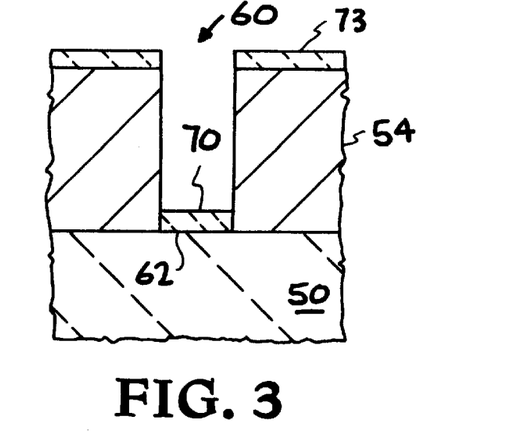
FIG. 3 is a fragmentary vertical side-section view of the structure of FIG. 2 after the first step of the sputter deposition process with sputtered material shown deposited on the bottom surface of the opening and on the top surface of the insulation layer.

Turning now to FIGS. 2 and 3, a fragmentary portion of semiconductor substrate 50 is shown having an insulating layer 54 formed thereon and a via/contact opening 60 etched through insulating layer 54 down to substrate 50. In a first step to deposit a material principally over bottom portion 62 of opening 60, the sputter deposition is carried out at high pressure while maintaining the RF source connected to the coil at high power, a high power RF bias on the pedestal (which establishes a negative self-bias on the pedestal), and a low power DC bias on the sputtering target to thereby sputter deposit material over bottom portion 62 of opening 60, as shown at 70 in FIG. 3.

By high pressure is meant that the pressure in sputter deposition chamber 12 is maintained at a level of at least about 35 millitorr. Preferably the pressure will range from about 35 millitorr up to about 45 millitorr. Pressures above 45 millitorr should, however, be avoided because of poor deposition uniformity and a low deposition rate.

By high power RF energy applied to the coil within the chamber, which couples the energy to the plasma, is meant an RF power level applied to the coil equivalent to at least about 4 kilowatts (kw) for a 12 inch diameter coil, up to below a level which will not cause damage to the coil. Typically the high RF power to the coil will be in a range equivalent to from about 4 kw to about 5 kw for a 12 inch diameter coil.

By low DC target power is meant a DC power level at least sufficient to maintain the plasma (e.g., about 500 watts), but not greater than about 3 kw, and preferably not greater that about 1 kw.

By high power RF bias on the pedestal holding the substrate is meant an RF power level of at least about 400 watts up to a power level below the level at which any substantial sputtering of the material on the substrate would occur. That is, one will not want to bias the pedestal holding the substrate at a power level at which resputtering of the material previously deposited onto the substrate would occur. For example, when depositing TiN, resputtering will commence if an RF bias power level of about 500 watts or higher is applied to the pedestal.

The sputtering time during which material sputtered from the target will be sputtered on the bottom 62 of opening 60 in step 1 will depend upon the desired thickness of the deposited liner, as well as the type of material being sputtered. For example, for sputter deposition of titanium under the conditions specified for deposition step 1, a period of about 12 seconds would be required to deposit about 100 Angstroms of titanium 70 over bottom 62 of opening 60, as shown in FIG. 3. It should be noted that while the foregoing deposition conditions will direct the deposition principally toward the bottom of opening 60, there will be some minor deposition on the sidewalls of the opening as well. This will also be true for each subsequent deposition step as well, it being understood that the purpose of this process is to provide an adequate deposition in each region of the opening, and not to necessarily exclude any particular region, so as to provide, at the end of the five steps of the process, a deposition on all of the surfaces of the opening which is uniform in thickness.

c. Step 2 of the Process

Figure 4:
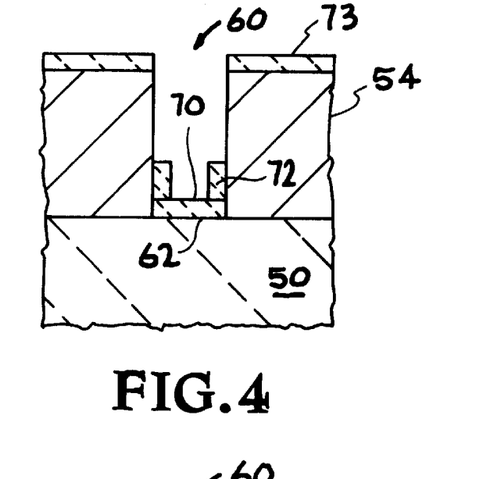
FIG. 4 is a fragmentary vertical side-section view of the structure of FIG. 3 after the second step of the sputter deposition process with sputtered material shown deposited on the lowest quartile of the sidewall surface of the opening.

In a second deposition step, the parameters of the first deposition step are retained except that the high power RF bias on the pedestal holding the substrate is reduced to a low power level to thereby increase the angular distribution of the sputtering material sufficiently to provide a deposition on the lowest quarter or quartile of the sidewall of the opening, as shown at 72 in FIG. 4. Preferably the bias is slowly reduced down to zero over the period of time during which step 2 is carried out. When the bias level is lowered from step 1 without such ramping to zero during the duration of step 2, the level to which the RF bias on the pedestal should be reduced at the commencement of step 2 (i.e., the low level) should be to within a range of from about 100 watts to about 200 watts.

As in step 1, the duration or total deposition time will depend upon the desired thickness of the sputter-deposited material. Typically, however, the deposition time for step 2 will be the same as in step 1 to ensure uniformity of thickness of the respective deposits in both steps. For example, for a titanium deposition, the time would again be about 12 seconds to deposit 100 Angstroms of titanium on the first (lowest) quartile of the sidewalls of opening 60, as shown at 72 in FIG. 4.

It should be noted that although the material deposited at 73 on the top surface of insulation layer 54 in FIGS. 3 and 4 (representing the results of step 1 and step 2 respectively) are depicted as of the same thickness, it will be understood that the thickness of the material deposited on the planar top surface of the layer (unlike the stepped surfaces) will continue to increase with each deposition step. However, since the total thickness of the sputtered material is only about 500 Angstroms, such buildup on the surface is of no consequence since the metal interconnect, e.g., aluminum, is usually about 6,000 Angstroms or more.

d. Step 3 of the Process

In the third deposition step, the RF bias on the pedestal is at zero (in an off position), and the low DC bias on the target and the high RF power on the coil are both maintained. However, during the third deposition step, the pressure in the chamber is reduced to a medium pressure state, resulting in a further increase in the angular distribution of the sputtered material to result in deposition on the second quartile of the depth of the opening, as shown at 74 in FIG. 5, i.e., to complete the deposition on the lower one-half of the sidewall of opening 60.

By medium pressure is meant that the pressure within sputter deposition chamber 12 is maintained within a range of from about 10 millitorr to below 35 millitorr. Preferably, the medium pressure maintained within chamber 12 during this third deposition step will range from about 20 millitorr to about 30 mlllitorr, and most preferably from about 24 millitorr to about 26 millitorr, with the pressure typically maintained at about 25 millitorr. Again the deposition time will vary with the desired thickness, with the deposition time preferably ranging from about ½ to about ¾ of the deposition time in steps 1 and 2, typically about ⅝ of the time of steps 1 and 2.

Figure 5:
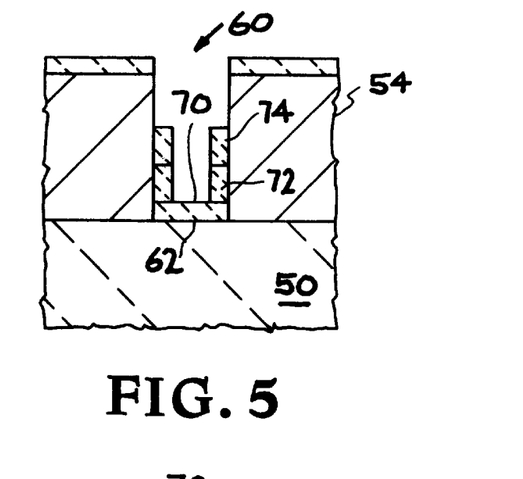
FIG. 5 is a fragmentary vertical side-section view of the structure of FIG. 4 after the third step of the sputter deposition process with sputtered material shown deposited on the second quartile of the sidewall surface of the opening.

Again referring to the titanium benchmark, to deposit titanium, for example, under the deposition conditions of step 3 would require a deposition time of about 7.5 seconds to deposit 100 Angstroms of titanium over the second quartile of the sidewall of opening 60, as shown at 74 in FIG. 5.

e. Step 4 of the Process

In the fourth deposition step, the pressure remains at a medium level, the RF bias applied to the pedestal remains at zero, and the DC bias power on the target remains in a low state. However, in this step, the RF power coupled to the plasma through the coil is reduced to a low level, resulting in a further increase in the angular distribution of the sputtered material and deposition on the sidewalls of the third quartile from the bottom of the opening, resulting in the sidewall deposition shown at 76 in FIG. 6.

Figure 6:
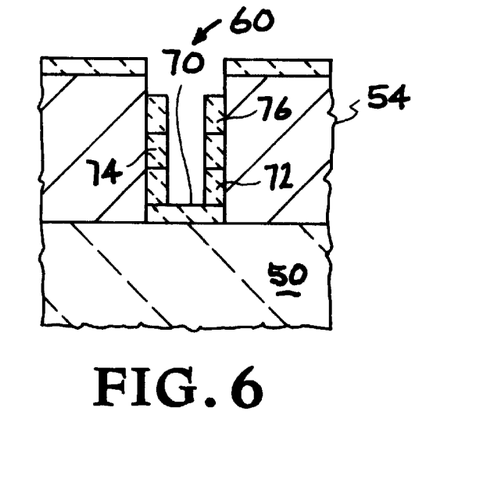
FIG. 6 is a fragmentary vertical side-section view of the structure of FIG. 5 after the fourth step of the sputter deposition process with sputtered material shown deposited on the third quartile of the sidewall surface of the opening.

By low level RF power applied to the coil is meant a power level ranging from at least about 1 kw up to a level below the RF power level maintained during the first three deposition steps. If the RF power on the coil is too high, the conditions of step 3 will only be replicated (the angular distribution of the material will not be increased), and deposition on the third quartile will be starved, i.e., leaving a thinner barrier layer at this point on the sidewall of opening 60 than desired, while unduly thickening the barrier layer thickness at 74. On the other hand, if the RF power is reduced too much, the result will be to again starve the deposition at 76 (the third quartile), but such a reduction will (because of the further increase in the angular distribution of the beam of sputtered material) shift the deposition upwardly to the fourth quartile of the sidewall of opening 60, resulting in too much material deposited at the top of opening 60, which could result in a necking in of the barrier layer, to shut off the opening (thereby creating a void) or at least impede the later filling of the opening with other conductive material. Preferably the RF power applied to the coil will range from about 1 kw to about 3 kw, and most preferably from about 1 kw to about 2 kw.

The time of the deposition will again depend upon the desired thickness of the deposited barrier layer at 76 in FIG. 6. Preferably, the deposition time will be the same as in step 3, i.e., ranging from about ½ to about ¾ of the deposition time in steps 1 and 2, typically about ⅝ of the time of steps 1 and 2. Again, as an example, for a titanium deposition of about 100 Angstroms, the deposition time would be about 7.5 seconds under the deposition conditions of step 4.

f. Step 5 of the Process

Figure 7:
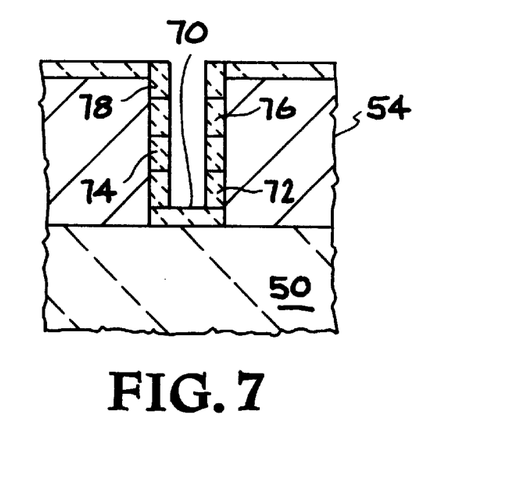
FIG. 7 is a fragmentary vertical side-section view of the structure of FIG. 6 after the fifth step of the sputter deposition process with sputtered material shown deposited on the remaining sidewall surface of the opening.

Finally, material is deposited on the last quartile of the sidewall of the opening, as shown at 78 in FIG. 7, upon by further lowering the pressure to a low pressure state and applying a high DC power to the target, while maintaining the RF power to the coil at a low power and leaving the level of RF bias power applied to the pedestal at zero.

By maintaining a low pressure in the sputtering chamber is meant a pressure below 10 millitorr, but sufficient to prevent the plasma from extinguishing (i.e., above about 0.5 millitorr). Preferably the pressure in the sputtering chamber during the fifth step will be maintained within a range of from about 1 millitorr to about 5 millitorr, and most preferably from about 1 millitorr to about 3 millitorr, typically about 2 millitorr.

By high DC power applied to the target is meant a DC bias power greater than 3 kw, and preferably at least about 5 kw up to a power level below that at which damage to the target would be sustained, usually a level not exceeding about 10 kw.

The deposition time will again be controlled by the desired thickness of the barrier layer. Preferably, the time for the fifth deposition step will range from about ⅛ to about ⅜ the deposition time for steps 1 and 2, and typically will be about ¼ of the deposition time in steps 1 and 2. For example, under the deposition conditions of step 5, the time required to deposit 100 Angstroms of titanium at 78 in FIG. 7 would be approximately 3 seconds.

Figure 8:
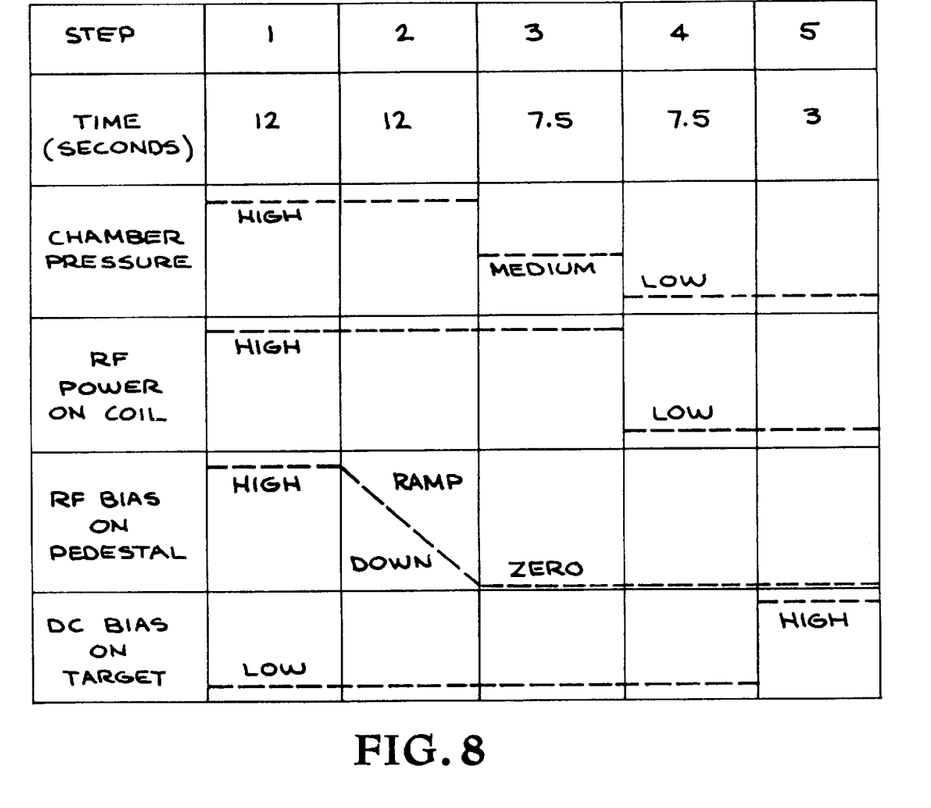
FIG. 8 is a graph depicting the five sputter deposition steps of the invention when a titanium barrier layer of uniform thickness is deposited on the bottom and sidewalls of an opening formed through a layer in an integrated circuit structure.
Figure 9:
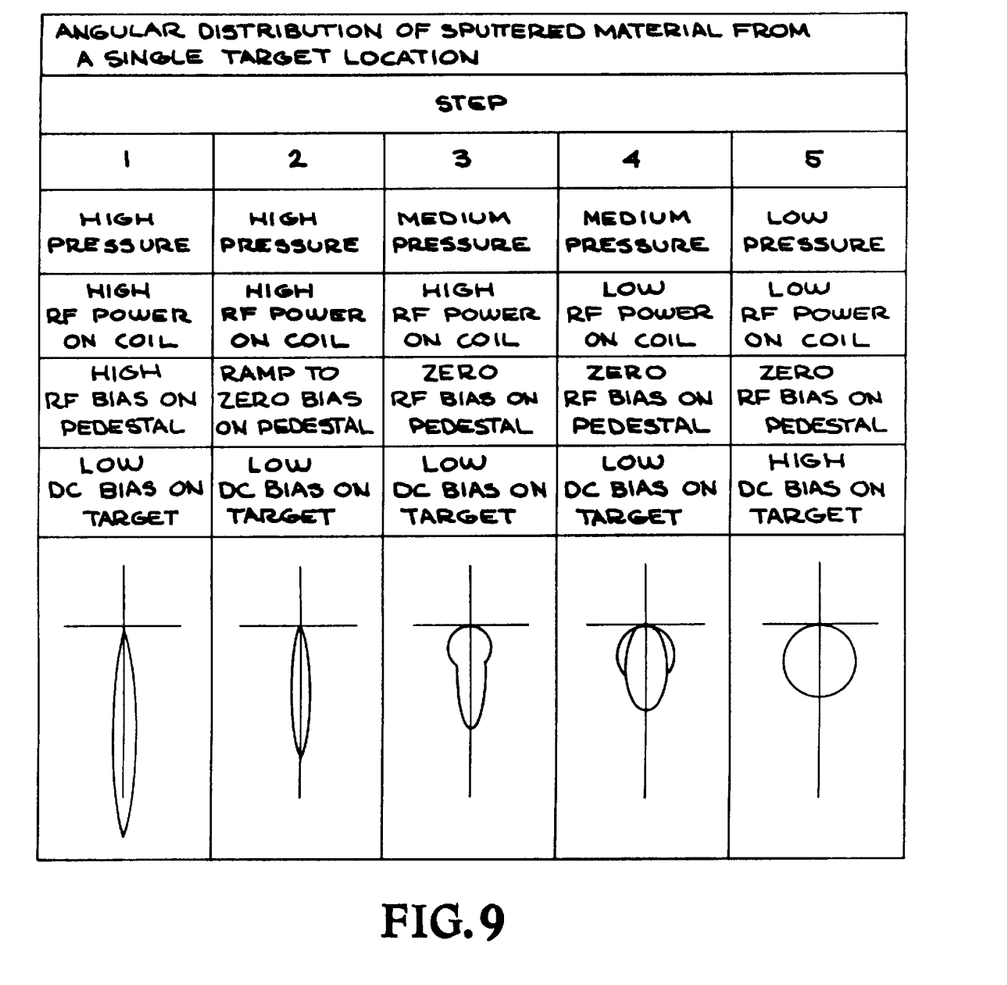
FIG. 9 illustrates changes in the angular distribution of sputtered material from a single target location as the deposition parameters are changed in the five deposition steps of the invention.
Figure 10:
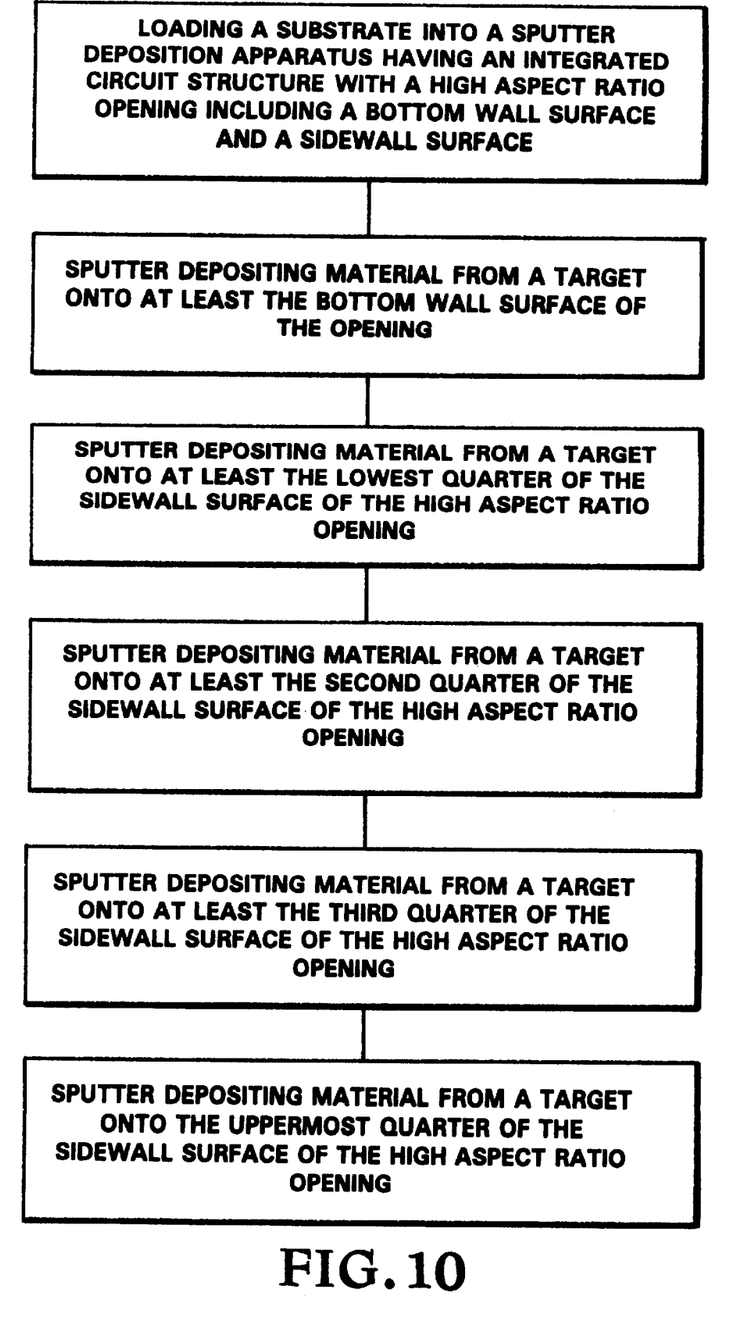
FIG. 10 is a flowsheet showing the process of the invention.

FIGS. 8–10 outline the multiple step process of the invention showing the changes in the various parameters during the respective five sputter deposition steps. The graph of FIG. 8 depicts the changes in the four previously discussed during five sputter deposition steps of the invention when a titanium barrier layer of uniform thickness is deposited on the bottom and sidewalls of the stepped surface of an integrated circuit structure; while FIG. 9 illustrates the changes in angular distribution of the sputtered material as the deposition parameters are changed in the five deposition steps of the invention; and FIG. 10 generally shows the process of the invention in flowsheet form.

FIG. 11, in addition to illustrating multiple chamber apparatus 10*a,* shows a computer system wherein the process steps depicted in FIGS. 8–10 can be implemented as a software routine or routines executed by a computer system controlling the one or more sputter deposition chambers utilized by the process. The process chambers 12*a*–12*d* of multichamber apparatus 10*a* of FIG. 11 are shown coupled to a microprocessor controller 90 which then controls each of the previously discussed four deposition parameters as they are changed through the various deposition steps. Controller 90 contains a central processing unit (CPU) 92, a memory 94 (e.g., RAM, ROM, removable storage, hard disk, and the like), and conventional support circuits 96 (e.g., cache, I/O circuits and peripherals, power supply, clock circuits, and the like). Controller 90 may comprise a general purpose computer that is programmed to operate as a specific purpose computer when executing the process of the present invention. Controller is coupled to single chamber apparatus 10 of FIG. 1 or multichamber apparatus 10*a* of FIG. 11 via a communication bus 98.

To further illustrate the process of the invention, an opening, having an aspect ratio of about 3.0, can be formed in an insulating layer extending down to an underlying semiconductor substrate. The substrate is placed in a sputter deposition chamber having a titanium target to be sputtered. Argon is flowed into the chamber to provide an initial pressure of 35 millitorr in the chamber. An RF power level of 4.5 kw would be applied to the coil in the sputtering chamber while applying a 1 kw DC bias on the target and an RF bias of about 400 watts to the pedestal in which the substrate is mounted. After plasma ignition, the first deposition step can be carried out for about 12 seconds, after which the RF bias is slowly reduced (ramped) down to zero over a further 12 second period during the second deposition step (with the other parameters remaining the same).

The pressure in the sputtering chamber is then reduced to a medium pressure of about 25 millitorr and the third deposition step is carried out for 7.5 seconds at this pressure (with the other parameters remaining the same). In a fourth deposition step, the RF coil power is then reduced down to about 2 kw and the deposition is carried out for a further 7.5 seconds. Finally, in the fifth deposition step, the DC target power is increased to about 4 kw and the pressure is further reduced down to about 2 millitorr for a further 3 second deposition period. The five titanium deposition steps, and the variations in the deposition parameters during the five steps are graphically depicted in FIG. 8.

The plasma is then extinguished and the substrate can then be removed from the deposition chamber for inspection. The deposited barrier layer on the lined opening in the insulating layer on the substrate will, upon examination, be found to be sufficiently uniform in thickness throughout the depth of the barrier-lined opening to form an adequate barrier layer without overfilling.

Although the invention and process for filling apertures has been described in terms of varying the power and/or pressure in conjunction with an inductively coupled plasma, the invention may also be practiced with other plasma sources wherein a high degree of ionization of the material to be deposited in the apertures is achievable. For example, the invention can be practiced with an electron cyclotron resonance (ECR) or hollow cathode source. By reducing the process pressure adjacent the wafer using such devices, or by increasing the wafer bias, greater directionality in the deposited species may be achieved. For example, using an ECR source, a high density plasma may be struck in the chamber to ionize the deposited species, and a high bias placed on the wafer to provide a high directionality to the depositing species and thus good bottom coverage. By changing the deposition regimen to a non-high density plasma regimen, which may be achieved such as by providing capacitive coupling to a plasma through a sputtering target, which will result in the formation of a stream of sputtered particles travelling in paths which, in part, contact the substrate at angles substantially non-parallel to the depth direction of the aperture, sidewall coverage is obtained. Likewise, if the ECR plasma is maintained but bias on the wafer is substantially reduced or eliminated, and/or the pressure in the system is substantially increased, scattering of the deposition species by collision in the case of the increased pressure, or random deposition in the case where the wafer bias is eliminated or substantially reduced, will result in sidewall coverage. Similar effects may be provided using a hollow cathode source, wherein the deposition material may be ejected from the source, or a high density plasma may be achieved by electron donation from the source to provide a resulting high plasma density and resulting ionized species, to provide directional deposition and bottom coverage, but pressure increases, deposition regime variations (such as a switch to cathode style sputtering) or wafer bias attenuation may be used to provide the sidewall coverage. Thus, any system capable of providing directional deposition in which the directionality can be attenuated to provide sidewall coverage can be modified to practice the invention and thus provide void-free filling of deep, narrow features.

Thus, the invention provides a process wherein a conformal layer of uniform thickness may be formed over stepped surfaces by a gradual increase in the angular distribution of the beam of material being sputtered onto the stepped surface. These variations in the angular distribution of the sputtered material, as well as the variations in deposition parameters, are shown in FIG. 9. As a result, for example, thin barrier layers of even thickness may be formed on stepped surfaces of an integrated circuit structure, including the surfaces of a high aspect ratio opening in an insulation layer, thereby making it possible to subsequently fill the lined opening with a high conductivity filler material. While the process has been described and illustrated in connection with the sputtering of a uniform deposition of material on the bottom and sidewall surfaces of a high aspect ratio opening via or contact opening, it will be understood that the process may be used in connection with the sputtering of a conformal coating over any stepped surface on an integrated circuit structure such as the surfaces of a narrow (high aspect ratio) trench, or the surfaces of other closely spaced raised portions of the structure.

Having thus described the invention what is claimed is:

1. A multiple step process for sputter depositing a material of uniform thickness over a stepped surface of an integrated circuit structure on a semiconductor substrate on a support pedestal in a sputter deposition chamber having a sputtering target and an RF coil therein for coupling RF energy to a plasma maintained between the target and the support pedestal which comprises:
   a) in a first sputter deposition step, sputter depositing material from said target onto at least a lowest region of said stepped surface while:
      i) maintaining said chamber at a high pressure;
      ii) providing a high power RF energy to said coil in said deposition chamber;
      iii) applying a high power RF bias to said pedestal supporting said substrate being deposited upon; and
      iv) applying a low power DC bias to said sputtering target;
   b) then, in a second, sputter deposition step, reducing said high power RF bias on said pedestal to a lower power while continuing to deposit on said stepped surface, to thereby deposit at least on a first higher region of said stepped surface;
   c) then, in a third sputter deposition step, applying no RF bias to said pedestal and reducing said pressure in said sputtering chamber to a medium pressure, while continuing to deposit on said stepped surface, to thereby deposit material on at least a second higher region of said stepped surface;
   d) then, in a fourth sputter deposition step, reducing said high power RF energy to said coil to low power RF energy while continuing to deposit on said stepped surface, to thereby deposit material on at least a third higher region of said stepped surface; and
   e) then, in a fifth sputter deposition step, lowering said pressure in said chamber further to a low pressure state and applying a high power DC bias to said target, while continuing to deposit material on said stepped surface, to thereby deposit material on at least a highest region of said stepped surface;

whereby a uniform thickness of material is sputtered onto said stepped surface.

2. The process of claim 1 wherein said sputtering chamber is maintained at a high pressure of at least 35 millitorr during said first and second sputter deposition steps.

3. The process of claim 1 wherein said sputtering chamber is maintained at a medium pressure of from 10 millitorr to below 35 millitorr during said third and fourth sputter deposition steps.

4. The process of claim 1 wherein said sputtering chamber is maintained at a low pressure of below 10 millitorr during said fifth sputter deposition step.

5. The process of claim 1 wherein said high power RF energy to said coil is maintained at a power level of at least about 4 kilowatts (kw) during said first, second, and third sputter deposition steps.

6. The process of claim 1 wherein said low power RF energy to said coil is maintained at a power level of not greater than about 3 kilowatts (kw) during said fourth and fifth sputter deposition steps.

7. The process of claim 1 wherein said high power RF bias on said pedestal is maintained at a power level of at least about 400 watts during said first sputter deposition step.

8. The process of claim 1 wherein said low power RF bias on said pedestal is maintained at a power level of from about 100 watts to about 200 watts during said second sputter deposition step.

9. The process of claim 1 wherein said RF bias on said pedestal is maintained at a power level of 400 watts during said first deposition step, and is ramped down during said second sputter deposition step to reach a level of zero at the commencement of said third deposition step.

10. The process of claim 1 wherein said low power DC target power is maintained at a power level of not greater than 3 kw during said first four sputter deposition steps.

11. The process of claim 1 wherein said high power DC target power is maintained at a power level greater than 3 kw during said fifth sputter deposition step.

12. The process of claim 1 wherein one or more of said sputter deposition steps are carried out in a first sputter deposition chamber and one or more of said sputter deposition steps are carried out in a second deposition chamber.

13. A multiple step process for sputter depositing a material of uniform thickness over a stepped surface of an integrated circuit structure on a semiconductor substrate on a support pedestal in a sputter deposition chamber having a sputtering target and an RF coil therein for coupling RF energy to a plasma maintained between the target and the support pedestal which comprises:

a) in a first deposition step, sputter depositing material from said target onto at least a lowest region of said stepped surface while:
        i) maintaining said chamber at a high pressure of at least 35 millitorr;
        ii) providing a high power RF energy of at least about 4 kilowatts (kw) to said coil in said deposition chamber;
        iii) applying a high power RF bias of at least about 400 watts to said pedestal supporting said substrate being deposited upon; and
        iv) applying a low power DC bias of not greater than 3 kw to said sputtering target;
    b) then, in a second deposition step, reducing said high power RF bias on said pedestal to a lower power of from about 100 watts to about 200 watts while continuing to deposit on said stepped surface, by maintaining said high pressure in said chamber and while maintaining said low power DC bias on said target and said high power RF energy to said coil, to thereby deposit on a first higher region of said stepped surface;
    c) then, in a third deposition step, applying no RF bias to said pedestal and reducing said pressure in said sputtering chamber to a medium pressure of from 10 millitorr to below 35 millitorr, while continuing to deposit on said stepped surface by maintaining said low power DC bias on said target and said high power RF energy to said coil to thereby deposit material on a second higher region of said stepped surface;
    d) then, in a fourth deposition step, reducing said high power RF energy to said coil to low power RF energy of not greater than about 3 kw, while continuing to deposit on said stepped surface, by continuing to maintain said pressure in said chamber at said medium level and said DC bias on said target at a low power, with no RF bias applied to said pedestal to thereby deposit material on a third higher region of said stepped surface; and
    e) then, in a fifth deposition step, lowering said pressure in said chamber further to a low pressure state of below 10 millitorr and applying a high power DC bias to said target of greater than 3 kw, while continuing to deposit material on said stepped surface by maintaining said RF energy to said coil at a low power level and no RF bias applied to said pedestal, to thereby deposit material on a highest region of said stepped surface;

whereby a uniform thickness of material is sputtered onto substantially all of said stepped surface.

14. The process of claim 13 where said first and second deposition steps are carried out for the same length of time to provide for uniformity of thickness in material deposited during said first and second deposition steps.

15. The process of claim 14 wherein said third and fourth deposition steps are carried out for the same length of time and the deposition time for said third and fourth deposition steps are from about ½ to about ¾ of the deposition time of said first and second deposition steps to provide for uniformity of thickness in material deposited during said first, second, third, and fourth deposition steps.

16. The process of claim 15 wherein the deposition time of said fifth deposition step is from about ⅛ to about ⅜ of the deposition time of said first and second deposition steps to provide for uniformity of thickness in material deposited during said five deposition steps.

17. The process of claim 15 wherein the deposition time of said fifth deposition step is about ¼ of the deposition time of said first and second deposition steps to provide for uniformity of thickness in material deposited during said five deposition steps.

18. The process of claim 14 wherein said third and fourth deposition steps are carried out for the same length of time and the deposition time for said third and fourth deposition steps are about ⅝ of the deposition time of said first and second deposition steps to provide for uniformity of thickness in material deposited during said first, second, third, and fourth deposition steps.

19. A multiple step process for sputter depositing a material of uniform thickness onto bottom and sidewall surfaces of a high aspect ratio opening formed through an insulating layer of an integrated circuit structure on a semiconductor substrate mounted on a support pedestal in a sputter deposition chamber having a sputtering target and an RF coil therein for coupling RF energy to a plasma maintained between the target and the support pedestal which comprises:

a) in a first deposition step, sputter depositing material from said target onto at least the bottom surface of said high aspect ratio opening while:
        i) maintaining said chamber at a high pressure of at least 35 millitorr;
        ii) providing a high power RF energy of at least about 4 kilowatts (kw) to said coil in said deposition chamber;
        iii) applying a high power RF bias of at least about 400 watts to said pedestal supporting said substrate being deposited upon; and
        iv) applying a low power DC bias of not greater than 3 kw to said sputtering target;
    b) then, in a second deposition step, reducing said high power RF bias on said pedestal to a lower power by ramping said RF bias down to a level of zero at the end of said second deposition step, while maintaining said high pressure in said chamber and while maintaining said low power DC bias on said target and said high power RF energy to said coil, to thereby deposit material on at least a lowest quartile of said sidewall surface;
    c) then, in a third deposition step, applying no RF bias to said pedestal and reducing said pressure in said sputtering chamber to a medium pressure of from 10 millitorr to below 35 millitorr, while maintaining said low power DC bias on said target and said high RF power to said coil, to thereby deposit material on at least a second quartile of said sidewall surface;
    d) then, in a fourth deposition step, reducing said high power RF energy to said coil to low power RF energy of not greater than about 3 kw, while maintaining said pressure at said medium level and said DC bias on said target at a low state, with no RF bias applied to said pedestal to thereby deposit material on at least a third quartile of said sidewall surface; and
    e) then, in a fifth deposition step, lowering said chamber pressure further to a low pressure state of below 10 millitor and applying a high power DC bias of greater than 3 kw to said target, while maintaining said RF energy to said coil at said low power level and no RF bias applied to said pedestal, to thereby deposit material on at least a fourth quartile of said sidewall surface;

whereby a uniform thickness of material is sputtered onto substantially all of said bottom and sidewall surfaces of said high aspect ratio opening in said integrated circuit structure.

20. The process of claim 19 wherein said sputtering chamber is maintained at a medium pressure of from 20 millitorr to about 30 millitor during said third and fourth deposition steps.

21. The process of claim 19 wherein said sputtering chamber is maintained at a low pressure of from about 1 millitor to about 5 millitorr during said fifth deposition step.

22. The process of claim 19 wherein said high power RF energy to said coil is maintained at a power level of from at least about 4 kw to about 5 kw during said first, second, and third deposition steps.

23. The process of claim 19 wherein said low power RF energy to said coil is maintained at a power level of from about 1 kw to about 3 kw during said fourth and fifth deposition steps.

24. The process of claim 19 wherein said high power DC target power maintained at a power level of at least about 5 kw during said fifth deposition step.

25. The process of claim 19 wherein the material sputtered onto the bottom and sidewall surfaces of said opening is selected from the group consisting of titanium, titanium nitride, tantalum nitride, tungsten nitride, and copper.

26. The process of claim 19 where said first and second deposition steps are carried out for the same length of time to provide for uniformity of thickness in material deposited during said first and second deposition steps.

27. The process of claim 19 wherein said third and fourth deposition steps are carried out for the same length of time and the deposition time for said third and fourth deposition steps are from about ½ to about ¾ of the deposition time of said first and second deposition steps to provide for uniformity of thickness in material deposited during said first, second, third, and fourth deposition steps.

28. The process of claim 19 wherein said third and fourth deposition steps are carried out for the same length of time and the deposition time for said third and fourth deposition steps are about ⅝ of the deposition time of said first and second deposition steps to provide for uniformity of thickness in material deposited during said first, second, third, and fourth deposition steps.

29. The process of claim 19 wherein the deposition time of said fifth deposition step is from about ⅛ to about ⅜ of the deposition time of said first and second deposition steps to provide for uniformity of thickness in material deposited during said five deposition steps.

30. The process of claim 19 wherein the deposition time of said fifth deposition step is about ¼ of the deposition time of said first and second deposition steps to provide for uniformity of thickness in material deposited during said five deposition steps.

31. A multiple step process for sputter depositing a titanium layer of uniform thickness onto bottom and sidewall surfaces of a high aspect ratio opening formed through an insulating layer of an integrated circuit structure on a semiconductor substrate mounted on a support pedestal in a sputter deposition chamber having a sputtering target and an RF coil therein for coupling RF energy to a plasma maintained between the target and the support pedestal which comprises:

a) in a first deposition step, sputter depositing titanium from said target onto at least the bottom surface of said high aspect ratio opening for a period of from about 10 to about 15 seconds while:

i) maintaining said chamber at a high pressure of at least 35 millitorr;

ii) providing thigh power RF energy of at least about 4 kilowatts (kw) to said coil in said deposition chamber;

iii) applying a high power RF bias of at least about 400 watts to said pedestal supporting said substrate being deposited upon; and         iv) applying a low power DC bias of not greater than 3 kw to said sputtering target;

b) then, in a second deposition step, carried out for the same period of time as in said first deposition step, reducing said high power RF bias on said pedestal to a lower power by ramping said RF bias down to a level of zero at the end of said second deposition step, while maintaining said high pressure in said chamber and while maintaining said low power DC bias on said target and said high power RF energy to said coil, to thereby deposit titanium on at least a lowest quartile of said sidewall surface;

c) then, in a third deposition step, carried out for a period of time of from about ½ to about ¾ of the deposition time of said first and second deposition steps, applying no RF bias to said pedestal and reducing said pressure in said sputtering chamber to a medium pressure of from 10 millitorr to below 35 millitorr, while maintaining said low power DC bias on said target and said high RF power to said coil, to thereby deposit titanium on at least a second quartile of said sidewall surface;

d) then, in a fourth deposition step, carried out for a period of time of from about ½ to about ¾ of the deposition time of said first and second deposition steps, reducing said high power RF energy to said coil to low power RF energy of not greater than about 3 kw, while maintaining said pressure at said medium level and said DC bias on said target at a low state, with no RF bias applied to said pedestal to thereby deposit titanium on at least a third quartile of said sidewall surface; and     e) then, in a fifth deposition step, carried out for a period of time of from about ⅛ to about ⅜ of the deposition time of said first and second deposition steps, lowering said chamber pressure further to a low pressure state of below 10 millitorr and applying a high power DC bias of greater than 3 kw to said target, while maintaining said RF energy to said coil at said low power level and no RF bias applied to said pedestal, to thereby deposit titanium on at least a fourth quartile of said sidewall surface;

whereby a uniform thickness of titanium is sputtered onto substantially all of said bottom and sidewall surfaces of said high aspect ratio opening in said integrated circuit structure.

32. A multiple step process for sputter depositing a material of uniform thickness over a stepped surface of an integrated circuit structure on a semiconductor substrate on a support pedestal in a sputter deposition chamber having a sputtering target and at least one energy source to provide RF energy to a plasma maintained between the target and the support pedestal which comprises:

a) in a first deposition step, sputter depositing material from said target onto at least a lowest region of said stepped surface while:

i) maintaining said chamber at a high pressure;

ii) providing a high power energy to said plasma in said deposition chamber;

iii) applying a high power RF bias to said pedestal supporting said substrate being deposited upon; and         iv) applying a low power DC bias to said sputtering target;

b) then, in a second deposition step, reducing said high power RF bias on said pedestal to a lower power while continuing to deposit on said stepped surface, to thereby deposit at least on a higher region of said stepped surface;

c) then, in a third deposition step, applying no RF bias to said pedestal and reducing said pressure in said sputtering chamber to a medium pressure, while continuing, to deposit on said stepped surface, to thereby deposit material on at least a second higher region of said stepped surface;

d) then, in a fourth deposition step, reducing said high power energy to said plasma to low power RF energy while continuing to deposit on said stepped surface, to thereby deposit material on at least a third higher region of said stepped surface; and e) then, in a fifth deposition step, lowering said pressure in said chamber further to a low pressure state and applying a high power DC bias to said target, while continuing to deposit material on said stepped surface, to thereby deposit material on at least a highest region of said stepped surface;

whereby a uniform thickness of material is sputtered onto said stepped surface.

* * * * *